United States Patent [19]

Chun

[11] Patent Number: 4,701,633

[45] Date of Patent: Oct. 20, 1987

[54] LOW POWER CLOCK GENERATOR

[75] Inventor: Jino Chun, Houston, Tex.

[73] Assignee: Texas Instruments Incorporated, Dallas, Tex.

[21] Appl. No.: 728,739

[22] Filed: Apr. 30, 1985

[51] Int. Cl.⁴ .................. H03K 5/13; H03K 19/01; H03K 19/003; H03K 17/687

[52] U.S. Cl. .................. 307/269; 307/482; 307/578; 307/200 B; 307/443

[58] Field of Search ............ 307/200 B, 578, 584, 307/481, 482, 443, 269, 262, 264, 568

[56] References Cited

U.S. PATENT DOCUMENTS

| | | | |
|---|---|---|---|
| 4,081,701 | 3/1978 | White, Jr. et al. | 307/530 |
| 4,239,991 | 12/1980 | Hong et al. | 307/262 |
| 4,239,993 | 12/1980 | McAlexander et al. | 307/279 |
| 4,508,978 | 4/1985 | Reddy | 307/269 |
| 4,521,701 | 6/1985 | Reddy | 307/482 |
| 4,570,088 | 2/1986 | Nozaki et al. | 307/269 |

Primary Examiner—Stanley D. Miller
Assistant Examiner—Trong Quang Phan
Attorney, Agent, or Firm—John G. Graham

[57] ABSTRACT

A clock delay circuit of the type used in semiconductor dynamic read/write memory device employs pull-up and pull-down output transistors connected in series between a voltage supply and ground. Excess current in this series path is minimized by a circuit holding the gate of the output pull-up transistor to a low voltage until the gate of the pull-down transistor goes low. Then, the gate of the pull-up transistor is booted above the supply voltage. Also, tendency for the output voltage to rise above ground during the delay period is avoided.

12 Claims, 4 Drawing Figures

LOW POWER CLOCK GENERATOR

BACKGROUND OF THE INVENTION

This invention relates to clock generator circuits as used in semiconductor memory devices, and more particularly to delay circuits of the type employed in dynamic read/write memory devices.

Dynamic read/write memory devices are generally constructed as illustrated in U.S. Pat. No. 4,071,801 issued to White, McAdams, and Redwine (a 16K-bit device) and U.S. Pat. No. 4,293,993 issued to McAlexander, White and Rao (a 64K-bit device), both patents assigned to Texas Instruments. In such devices, a clock voltage is needed at a number of delay times. The circuits ordinarily used to generate these delayed clocks are of the type disclosed in U.S. Pat. No. 4,239,991, issued to Ngai H. Hong et al, assigned to Texas Instruments. Although, various methods have been employed to reduce the power dissipation in these clock delay circuits, the excess current is still a problem especially for high density devices of the 256K-bit and 1-Mbit size and also the physical size of the circuits and the output voltage characteristics have been unsatisfactory.

It is the principal object of this invention to provide improved, low-power, clock delay circuitry for dynamic read/write memory devices or the like. Another object is to avoid the excess sizes, and undesired output voltage characteristics of clock delay circuits.

SUMMARY OF THE INVENTION

In accordance with one embodiment of the invention, a clock delay circuit of the type used in semiconductor dynamic read/write memory devices employs pull-up and pull-down output transistors connected in series between a voltage supply and ground. Excess current in this series path is minimized by a circuit holding the gate of the output pull-up transistor to a low voltage until the gate of the pull-down transistor goes low. Then, the gate of the pull-up transistor is booted above the supply voltage. Also, tendency for the output voltage to rise above ground during the delay period is avoided.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein;

DETAILED DESCRIPTION OF SPECIFIC EMBODIMENT

Figure 1:
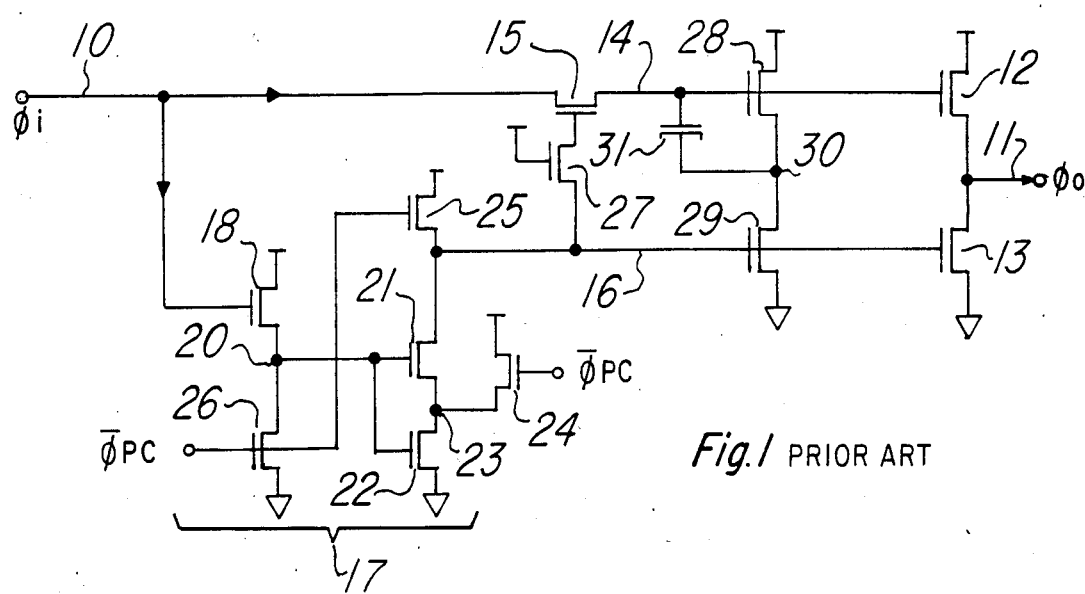
FIG. 1 is an electrical schematic diagram of a clock delay circuit of the prior art.
Figure 2:
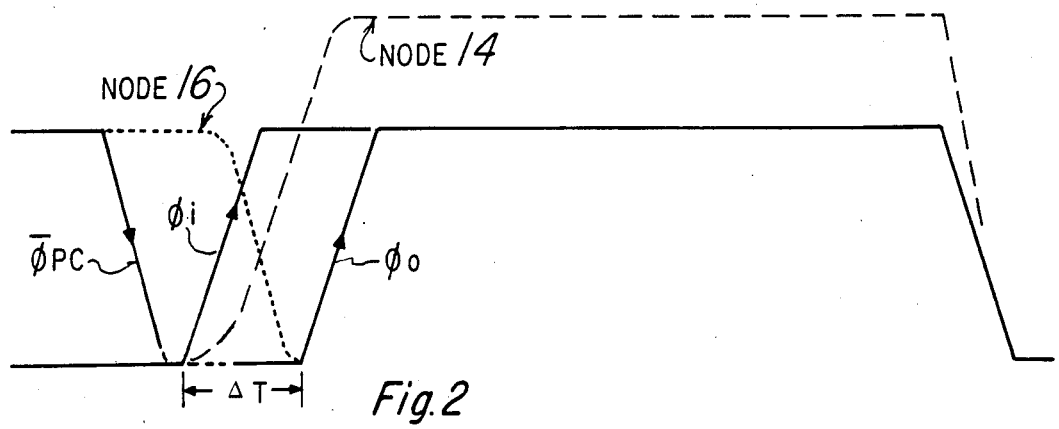
FIG. 2 is a timing diagram showing a plot of voltage vs. time for nodes in the circuit of FIG. 1.

Referring to FIG. 1, a clock generator circuit is illustrated according to the prior art. An input clock signal $\phi i$ is applied to input terminal 10 and results in an output clock $\phi o$ at output terminal 11; these signals are shown in FIG. 2, where the desired delay $\Delta T$ is apparent. The circuit employs an output stage having a large pull-up transistor 12 and a large pull-down transistor 13. The gate of the transistor 12 is connected to a booted node 14, and this node is connected through a coupling transistor 15 to the input terminal 10. The gate of the transistor 13 is connected to a node 16 which is the output of a delay circuit 17. This delay circuit has an input transistor 18 with its connected to the input terminal and its source connected to a node 20. The node 20 is connected to the gates of a pair of transistors 21 and 22 which have their source-to-drain paths in series between the node 16 and ground; a node 23 between the transistors 21 and 22 is precharged to the supply Vdd through a transistor 24, and node 20 is predischarged to Vss by transistor 26. The transistors 24, 25 and 26 all have a precharge clock $\overline{\phi pc}$ on their gates. The node 16 is coupled to the gate of the transistor 15 through a transistor 27 having the voltage Vdd on its gate. A pair of transistors 28 and 29, produce a positive-going transition on a node 30 which is coupled to the node 14 by a capacitor 31 to boot this node 14 above Vdd so that sufficient drive voltage is provided for pull-up transistor 12.

In operation, while $\phi i$ is low, $\overline{\phi pc}$ is high, and nodes 16 and 23 are pulled up to Vdd-Vt, while node 20 is held at Vss, by the transistors 24, 25 and 26. This holds the transistors 21 and 22 off, and isolates the nodes 16 and 23 from ground. Transistors 13 and 29 are held on, so output terminal 11 is at Vss, as well as node 30. The transistor 15 is held on by the voltage on node 16. Then, after $\overline{\phi pc}$ goes low, and $\phi i$ goes high, the input voltage coupled through the transistor 15 to the node 14 tends to begin to turn on the transistors 12 and 28. But the transistors 13 and 29 are held on for a bit due to the delay circuit 17. When $\phi i$ goes high, turning on the transistor 18, the node 20 begins to charge according to the AC time constant of the source-drain path of transistor 18 and the gate capacitance of transistors 21 and 22. When the voltage on the node 20 reaches the threshold Vt of the transistor 22, the node 23 begins to discharge, and capacitive coupling from node 23 to node 20 tends to hold the gate voltage on transistor 21 down for a short period. When node 23 is discharged, transistor 21 turns on quickly, discharging node 16 and turning off the transistors 13 and 29. Node 30 rises rapidly, and this positive-going transition is coupled to node 14 to drive the gate of transistor 12 above Vdd. The transistor 15 is turned off when node 16 goes low, isolating the input terminal 10 from the booted node 14.

The circuit of FIG. 1 has excessive power dissipation because as $\phi i$ goes high the transistors 12 and 28 are turned on while transistors 13 and 29 are still on. For the delay period of the delay circuit 17, perhaps 5 to 10 ns., static power is dissipated, and this current flow does not contribute to switching speed, i.e., is wasted.

Figure 3:
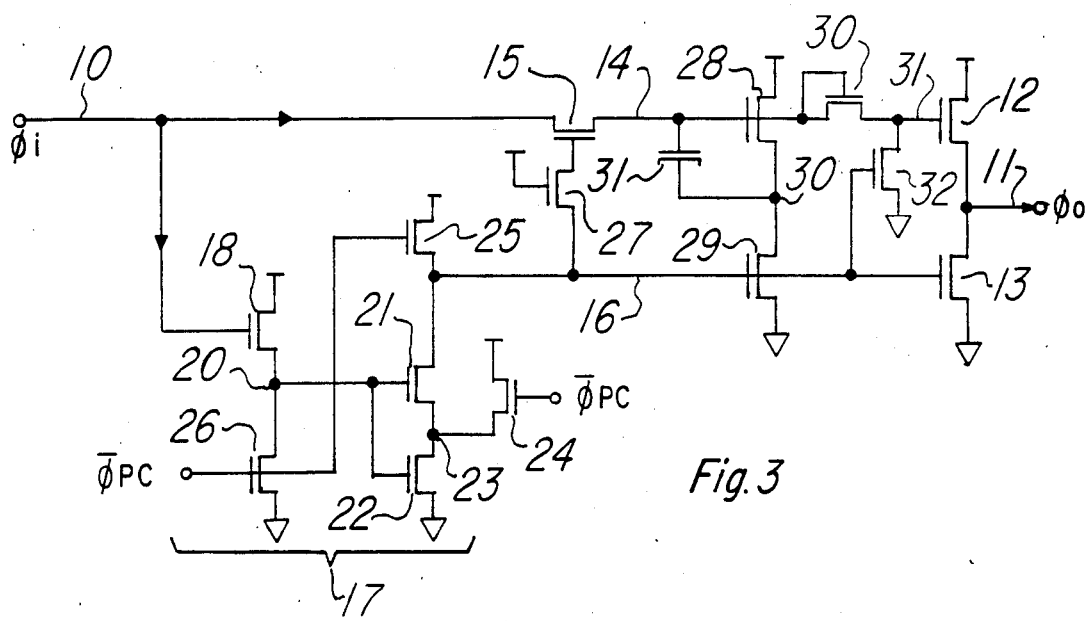
FIG. 3 is an electrical schematic diagram of a clock delay circuit according to the invention.
Figure 4:
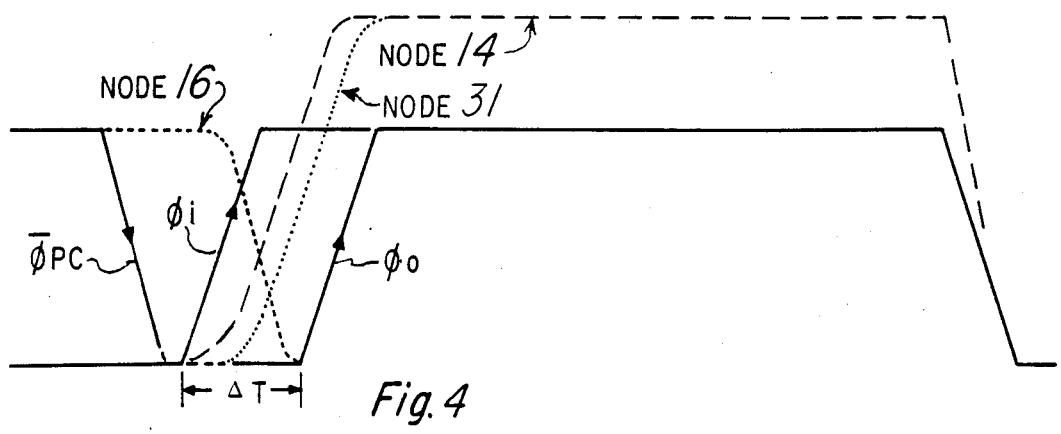
FIG. 4 is a timing diagram showing a plot of voltage vs. time for nodes 2 in the circuit of FIG. 3.

According to the invention, the circuit of FIG. 3 is the same as that of FIG. 1, with the addition of a transistor 30 between the node 14 and the gate 31 of the transistor 12, plus a transistor 32 having its gate connected to the node 16 and its source-drain path connecting the gate 31 to Vss. This addition functions to lower the gate voltage of the transistor 12 when it is not needed. During the delay period $\Delta T$ the transistor 30, with its gate shorted to drain, functions as a saturation device and the small pull-down transistor 32 holds the node 31 low (while node 16 is high). When node 16 goes low, the transistor 32 turns off, and the node 31 follows the booted node 14 to Vdd++; since there is no current flow in the transistor 30 its drop is very small. To compensate for the unavoidable delay introduced by this circuit, the transistor 12 is increased in size by about 20% in W/L ratio.

In addition to reducing the dissipation, the circuit of FIG. 3 eliminates the "front porch", i.e., the slight rise in the output $\phi$o during $\Delta T$, which can prematurely trigger critical circuits like sense amplifiers and intermediate output buffers in a DRAM having a noisy Vss bus line. Furthermore, the amount of delay $\Delta T$ can be varied more readily without excess power dissipation or front porch. The output pull-down device 13 can be reduced in size to less than 10% of the size (W/L ratio) of the prior art because of the lack of tendency to produce a front porch.

A further improvement is the elimination of the transistor 21 and the precharge transistor 24 in the circuit of FIG. 3, compared to FIG. 1. This is also possible because its is no longer necessary to have a steep fall time of node 16 (i.e., front porch is no longer a problem).

The sizes of the transistors 25 and 26 can be reduced to less than half in FIG. 3, compared to FIG. 1, reducing the amount of current needed to reset the circuit, contributing more to power reduction.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A clock delay circuit comprising:
   an input node receiving a positive-going input clock,
   an output node at which an output clock is produced having a positive-going transition delayed from said input clock by a delay period,
   an output pull-up transistor and an output pull-down transistor, each of said transistors having a source-to-drain path and a gate, the source-to-drain path of said pull-up transistor connected between a positive voltage supply and said output node, the source-to-drain path of said pull-down transistor connected between said output node and reference potential,
   a drive node, and coupling means connecting said input node to said drive node,
   means for booting said drive node to a higher voltage above said positive voltage supply after said delay period,
   delay means coupled between said input node and the gate of said output pull-down transistor to hold the voltage of said gate of said output pull-down transistor high until after said delay period,
   and hold-down means connected between said drive node and said gate of the output pull-up transistor and connected to a low voltage to hold said gate of said output pull-up transistor at a low voltage until after said delay period then to allow said gate of said output pull-up transistor to be booted to said higher voltage.

2. A circuit according to claim 1 wherein said hold-down means is a transistor having a source-to-drain path connected to the gate of said output pull-up transistor and to said low voltage.

3. A circuit according to claim 2 wherein said transistor of the hold-down means has a gate connected to the gate of said output pull-down transistor.

4. A circuit according to claim 1 wherein said coupling means includes the source-to-drain path of a coupling transistor.

5. A circuit according to claim 4 wherein said coupling transistor has a gate shorted to an end of the source-to-drain path of the coupling transistor.

6. A circuit according to claim 5 wherein the coupling means includes a series transistor having a gate coupled to the gate of said output pull-down transistor.

7. A clock delay circuit comprising:
   an input node receiving an input clock,
   an output node at which an output clock is produced having a transition delayed from said input clock by a delay period,
   an output pull-up transistor and an output pull-down transistor, each of said transistors having a source-to-drain path and a gate, the source-to-drain path of said pull-up transistor connected between one terminal of a voltage supply and said output node, the source-to-drain path of said pull-down transistor connected between said output node and another terminal of said power supply,
   a drive node, and coupling means including a series transistor connecting said input node to said drive node,
   capacitive means for booting said drive node to a voltage above said voltage supply after said delay period,
   delay means coupled between said input node and the gate of said output pull-down transistor to hold the voltage of said gate high until after said delay period,
   and hold-down means connected to said gate of the output pull-up transistor and to a low voltage to hold said gate at a low voltage until after said delay period and then to allow said gate of said output pull-up transistor to be booted to said higher voltage.

8. A circuit according to claim 7 wherein said hold-down means is a transistor having a source-to-drain path connected to the gate of said output pull-up transistor and to said low voltage.

9. A circuit according to claim 8 wherein said transistor of the hold-down means has a gate connected to the gate of said output pull-down transistor.

10. A circuit according to claim 7 wherein said coupling means includes the source-to-drain path of a coupling transistor.

11. A circuit according to claim 10 wherein said coupling transistor has a gate shorted to an end of the source-to-drain path of the coupling transistor.

12. A circuit according to claim 11 wherein said coupling means includes a series transistor having a gate coupled to the gate of said output pull-down transistor.

* * * * *